(12) United States Patent
Kim et al.

(10) Patent No.: US 10,824,557 B2
(45) Date of Patent: Nov. 3, 2020

(54) MEMORY SYSTEM PERFORMING VARIABLE READ RECLAIM OPERATION

(71) Applicant: SK hynix Inc., Gyeonggi-do (KR)

(72) Inventors: Dae Hong Kim, Gyeonggi-do (KR); Kyung Min Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 53 days.

(21) Appl. No.: 16/199,520

(22) Filed: Nov. 26, 2018

(65) Prior Publication Data

US 2019/0347196 A1     Nov. 14, 2019

(30) Foreign Application Priority Data

May 8, 2018  (KR) .................. 10-2018-0052751

(51) Int. Cl.
*G06F 3/06*     (2006.01)
*G06F 12/02*   (2006.01)
*G11C 16/34*   (2006.01)

(52) U.S. Cl.
CPC .......... *G06F 12/0253* (2013.01); *G06F 3/064* (2013.01); *G06F 3/0608* (2013.01); *G06F 3/0688* (2013.01); *G11C 16/3495* (2013.01); *G06F 2212/7205* (2013.01)

(58) Field of Classification Search
CPC ...... G06F 3/0608; G06F 3/064; G06F 3/0688; G06F 12/0253
See application file for complete search history.

(56) References Cited

U.S. PATENT DOCUMENTS

| | | | |
|---|---|---|---|
| 2016/0217032 A1* | 7/2016 | Yum | G06F 11/1048 |
| 2016/0342458 A1* | 11/2016 | Cai | G11C 16/3431 |
| 2017/0286288 A1* | 10/2017 | Higgins | G06F 3/0652 |
| 2019/0130983 A1* | 5/2019 | Singidi | G11C 11/5642 |
| 2019/0179741 A1* | 6/2019 | Liu | G11C 16/00 |

FOREIGN PATENT DOCUMENTS

KR     1020170065726     6/2017

* cited by examiner

*Primary Examiner* — Ryan Bertram
(74) *Attorney, Agent, or Firm* — IP & T Group LLP (57) ABSTRACT

A memory system may include a plurality of nonvolatile memory devices each including a plurality of memory blocks; and a controller configured to configure at least one memory block selected from the plurality of memory blocks as a super block, and to perform a read reclaim operation for the super block based on memory-block-read-counts of the super block, wherein the controller divides the super block into a plurality of page groups, selects at least one page group from the plurality of page groups based on the memory-block-read-counts, and performs the read reclaim operation.

13 Claims, 11 Drawing Sheets

| B0_0 | B1_0 | B2_0 | |
|---|---|---|---|
| P0_0 | P1_0 | P2_0 | ~371 |
| P0_1 | P1_1 | P2_1 | ~372 |
| P0_2 | P1_2 | P2_2 | ~373 |
| P0_3 | P1_3 | P2_3 | ~374 |
| P0_4 | P1_4 | P2_4 | ~375 |
| P0_5 | P1_5 | P2_5 | ~376 |

FIG.3B

| B0_0 | B1_0 | B2_0 | |
|---|---|---|---|
| P0_0 | P1_0 | P2_0 | |
| P0_1 | P1_1 | P2_1 | ~381 |
| P0_2 | P1_2 | P2_2 | |
| P0_3 | P1_3 | P2_3 | ~382 |
| P0_4 | P1_4 | P2_4 | |
| P0_5 | P1_5 | P2_5 | ~383 |

FIG.4 time → T1, T2, T3

| | T1 | T2 | T3 |
|---|---|---|---|
| Read Count(B0_0) | 150K | 180K | 200K |
| Read Count(B1_0) | 100K | 110K | 220K |
| Read Count(B2_0) | 30K | 50K | 180K |
| Difference Value | - | 30K | 40K |

MEMORY SYSTEM PERFORMING VARIABLE READ RECLAIM OPERATION

CROSS-REFERENCE TO RELATED APPLICATION

The present application claims priority under 35 U.S.C. § 119(a) to Korean application number 10-2018-0052751, filed on May 8, 2018, in the Korean Intellectual Property Office, which is incorporated herein by reference in its entirety.

BACKGROUND

1. Technical Field

Various embodiments of the present invention generally relate to a memory system and an electronic device. Particularly, the embodiments relate to a memory system including a nonvolatile memory devices and an electronic device.

2. Related Art

A memory system ay be configured to store data supplied from an external device in response to a write request from the external device. Furthermore, the memory system may be configured to provide the stored data to the external device in response to a read request from the external device. The external device is a device capable of processing data and may include a computer, a digital camera, a cellular phone and the like. The memory system may operate by being embedded in the external device, or may be operate by being fabricated in a separable form and electrically connected to the external device.

Since there is no mechanical driving part, the memory system using a memory device has advantages such as excellent stability and durability, high information access speed, and low power consumption. The memory system having such an advantage includes a universal serial bus (USB) memory device, a memory card having various interfaces, a universal flash storage (UFS) device, and a solid state drive (hereinafter, referred to as SSD).

SUMMARY

In an embodiment, a memory system may include a plurality of nonvolatile memory devices each including a plurality of memory blocks; and a controller configured to configure at least one memory block selected from the plurality of memory blocks as a super block, and to perform a read reclaim operation for the super block based on memory-block-read-counts of the super block, wherein the controller divides the super block into a plurality of page groups, selects at least one page group from the plurality of page groups based on the memory-block-read-counts, and performs the read reclaim operation.

In an embodiment, an operating method of a memory system including a plurality of nonvolatile memory devices each including a plurality of memory blocks may include step of configuring, by a controller, at least one memory block selected from the plurality of memory blocks as a super block; dividing, by the controller, the super block into a plurality of page groups; selecting, by the controller, at least one page group from the page groups; and performing a read reclaim operation for the selected at least one page group.

In an embodiment, an electronic device may include a controller; and a non-transitory machine-readable storage medium that includes a plurality of memory blocks and stores coded instructions executable by the controller, wherein the instructions includes instructions that substantially manage at least one memory block selected from the memory blocks as a super block, divide the super block into a plurality of page groups, decide a number of target page groups, for which a read reclaim for the super block is to be performed, based on memory-block-read-counts of the super block, and control a read reclaim operation to be performed for page groups having the decided number.

In an embodiment, a memory system may include a storage including a super block including a plurality of page groups each including at least a single page from one of a plurality of memory blocks forming the super block; and a controller configured to: detect maximum memory-block-read-counts of the super block at predetermined time points; obtain a variance of the maximum memory-block-read-counts between immediately previous and current ones among the predetermined time points; select a target number of target page groups among the plurality of page groups; and control the storage to perform a read reclaim operation to the target number of target page groups.

DETAILED DESCRIPTION

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

Hereinafter, a memory system, an operating method thereof, and an electronic device will be described below with reference to the accompanying drawings through various examples of embodiments.

Figure 1:
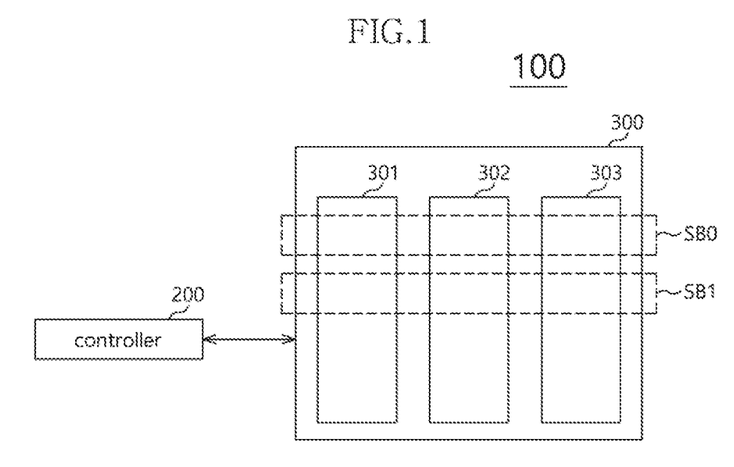
FIG. 1 is a block diagram schematically illustrating a configuration of a memory system in accordance with an embodiment.

FIG. 1 is a block diagram exemplarily illustrating a memory system 100 in accordance with an embodiment.

The memory system 100 may store data accessed by a host device (not illustrated) such as a cellular phone, a MP3 player, a laptop computer, a desktop computer, a game machine, a television, and an in-vehicle infotainment system.

The memory system 100 may be configured as one of various types of storage devices according to a host interface indicating a transmission protocol with the host device. For example, the memory system 100 may be configured as one of various types of storage devices such as a SSD, a MMC, an eMMC, a RS-MMC, a micro-MMC type multimedia card, a SD, a mini-SD, a micro-SD type secure digital card, a universal storage bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, and a memory stick.

The memory system 100 may be fabricated as one of various types of packages. For example, the memory system 100 may be fabricated as one of various types of packages such as a package on package (POP), a system in package (SIP), a system on chip (SOC), a multichip package (MCP), a chip on board (COB), a wafer-level fabricated package (WFP), and a wafer-level stack package (WSP).

Referring to FIG. 1, the memory system 100 may include a plurality of nonvolatile memory devices 301 to 303 each including a plurality of memory blocks, and a controller 200 configured to perform a read reclaim operation for super blocks SB0 and SB1 configured over the nonvolatile memory devices 301 to 303.

When a particular memory block is repeatedly read, an error bit increases in that particular memory block due to a problem such as read disturbance. During the read reclaim operation, data stored in the particular memory block is moved to another memory block before an uncorrectable error occurs in the data stored in that particular memory block.

The read reclaim operation may be performed in units of super blocks including a plurality of blocks. The controller 200 detects memory-block-read-counts of each of blocks included in the super block SB0 or SB1, and when a memory-block-read-count of at least one block is greater than or equal to a preset threshold, the read reclaim may be performed for all blocks included in the super block SB0 or SB1. In such a case, data stored in the blocks included in the super block SB0 or SB1 may be backed up to other blocks through a one-time read reclaim operation. In this case, although the memory-block-read-counts of the respective blocks included in the super block SB0 or SB1 are different and the memory-block-read-counts of remaining blocks are less than the preset threshold in that super block SB0 or SB1, the read reclaim operation is performed by units of the super blocks SB0 and SB1 and thus the number of erase/write cycles of the remaining blocks in that super block SB0 or SB1 may be unnecessarily increased.

Figure 2:
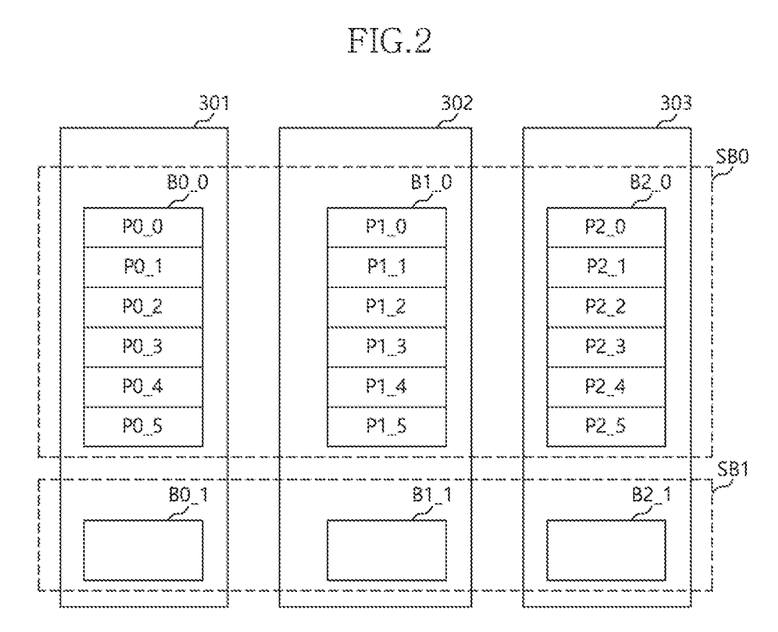
FIG. 2 is a diagram illustrating a configuration of a super block in accordance with an embodiment.

FIG. 2 is a diagram illustrating a configuration of the super blocks SB0 and SB1 in accordance with the embodiment.

Referring to FIGS. 1 and 2, the controller 200 may configure at least one selected memory block as a super block over the nonvolatile memory devices 301 to 303. Each of the memory blocks may include a plurality of pages. Although FIG. 2 illustrates, for convenience of description, that each of the three nonvolatile memory devices 301 to 303 includes memory blocks and each of the memory blocks B0_0, B0_1, B1_0, B1_1, B2_0, B2_1 includes pages P0_0 to P0_5, P1_0 to P1_5, P2_0 to P2_5, the embodiment is not limited thereto. For example, the number of the nonvolatile memory devices 301 to 303, the number of the memory blocks, and the number of the pages may vary depending on design. That is, the number of the nonvolatile memory devices 301 to 303, the number of the memory blocks, and the number of the pages may be any number greater than or equal to 1.

Each of the super blocks SB0 and SB1 may include blocks having substantially the same block offset in the nonvolatile memory devices 301 to 303. For example, the super block SB0 may include blocks B0_0, B1_0, and B2_0 having a block offset of a value 0 in each of the nonvolatile memory devices 301 to 303. The super block SB1 may include blocks B0_1, B1_1, and B2_1 having a block offset of a value 1 in each of the nonvolatile memory devices 301 to 303. However, the block offset may not be a reference for classifying the super blocks, and blocks used in order to form substantially the same super block may not be limited to substantially the same relative position in each of the nonvolatile memory devices thereof.

Figure 3A:
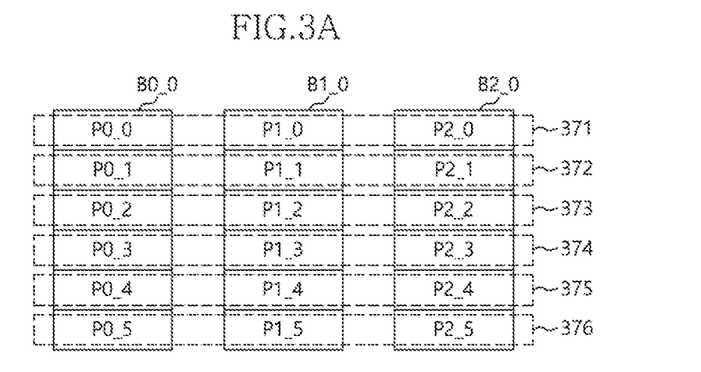
FIGS. 3A and 3B are diagrams illustrating a configuration in which a super block is divided into a plurality of page groups in accordance with an embodiment.
Figure 3B:
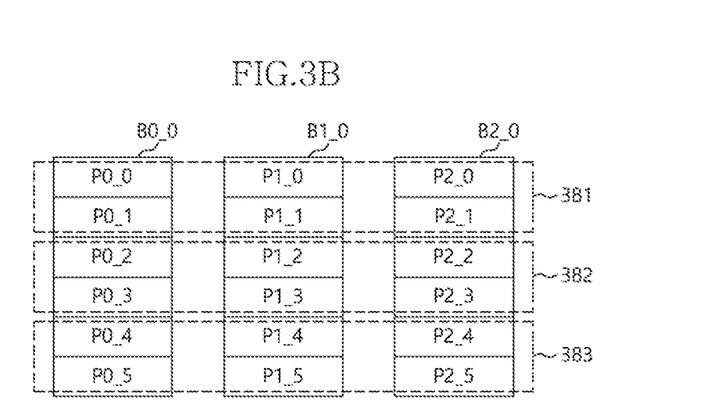

FIGS. 3A and 3B are diagrams illustrating a configuration in which the super block SB0 or SB1 is divided into a plurality of page groups in accordance with the embodiment. Although FIGS. 3A and 3B illustrate, for convenience of description, that each memory block includes pages having six offsets 0 to 5, the present invention is not limited thereto. That is, the number of pages and the number of offsets included in the memory blocks may vary depending on design.

Referring to FIGS. 3A and 3B, in accordance with the embodiment, respective page groups 371 to 376 and 381 to 383 may include at least one page from each of the memory blocks B0_0, B1_0, and B2_0.

In accordance with the embodiment, the page groups 371 to 376 may include one page from the memory blocks B0_0, B1_0, and B2_0, respectively. Particularly, pages having substantially the same page offset may be configured as substantially the same page group. For example, as illustrated in FIG. 3A, pages P0_0, P1_0, and P2_0 having the page offset of a value 0 may configure the first page group 371. Similarly, pages each having the page offsets of values 1 to 5 may respectively configure the second page group 372 to the sixth page group 376. That is, the page offset may be a reference for classifying page groups in a super block.

Referring to FIG. 3B, the page groups 381 to 383 may include two pages from the memory blocks B0_0, B1_0, and B2_0, respectively. The first page group 381 may include pages P0_0 and P0_1, P1_0 and P1_1, P2_0 and P2_1, respectively included in the blocks B0_0, B1_0, and B2_0 and respectively having page offsets of values 0 and 1. Similarly, the second page group 382 and the third page group 383 may include pages respectively included in the blocks B0_0, B1_0, and B2_0 and respectively having two page offsets.

For convenience of description, the three blocks B0_0, B1_0, and B2_0 and the pages, which have the six page offsets of values 0 to 5, have been described as an example. However, the number of the blocks, number of pages, and the number of the page offsets are not limited thereto and may be any number greater than or equal to 1.

Figure 4:
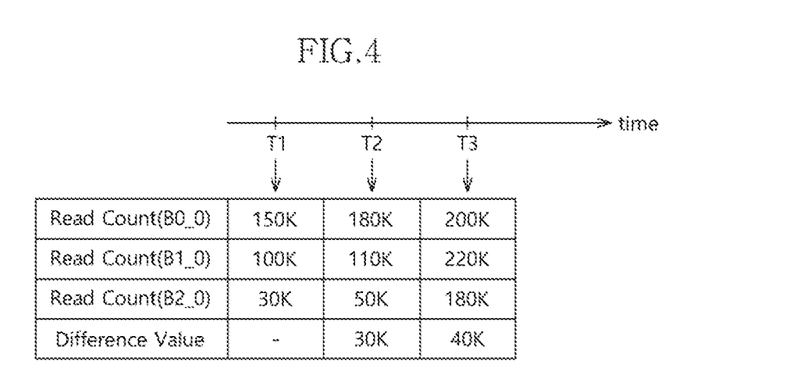
FIG. 4 is a diagram explaining a difference between maximum values of memory-block-read-counts in accordance with an embodiment.

FIG. 4 is a diagram explaining a difference between maximum values of memory-block-read-counts in accordance with the embodiment. For convenience of description, it is assumed in FIG. 4 that a super block includes the three blocks B0_0, B1_0, and B2_0 as illustrated in FIG. 3A.

Referring to FIGS. 1, 3A, and 4, a difference between maximum values of memory-block-read-counts in the respective blocks B0_0, and B2_0 may be detected at predetermined time points (e.g., T1, T2, and T3 in FIG. 4). In accordance with the embodiment, a number of page groups, for which a read reclaim operation is to be performed, may be decided on the basis of an adjusting number decided by comparing the maximum values of memory-block-read-counts and a critical reference. The adjusting number will be described later with reference to FIG. 5.

At a first time point T1, the controller 200 may measure memory-block-read-counts of the respective three blocks B0_0, B1_0, and B2_0 included in the super block. It is assumed that at the first time point T1, the memory-block-read-counts of the blocks B0_0, B1_0, and B2_0 are measured at 150 k, 100 k, and 30 k, respectively.

At a second time point T2, the controller 200 may measure memory-block-read-counts of the respective blocks B0_0, B1_0, and B2_0, wherein the memory-block-read-counts of the blocks B0_0, B1_0, and B2_0 are 180 k, 110 k, and 50 k, respectively. At the first time point T1, the memory-block-read-count 150 k of the block B0_0 is maximum, and at the second time point T2, the memory-block-read-count 180 k of the block B0_0 is also maximum. Accordingly, a difference value between the memory-block-read-counts at the first time point T1 and at the second time point T2 is 30 k.

At a third time point T3, the controller 200 may measure memory-block-read-counts of the respective blocks B0_0, B1_0, and B2_0, wherein the memory-block-read-counts of the blocks B0_0, B1_0, and B2_0 are 200 k, 220 k, and 180 k, respectively. At the second time point T2, the memory-block-read-count 180 k of the block B0_0 is maximum, and at the third time point T3, the memory-block-read-count 220 k of the block is maximum. Accordingly, a difference value between the memory-block-read-counts at the second time point T2 and at the third time point T3 is 40 k.

That is, in accordance with an embodiment of the present invention, the maximum memory-block-read-counts of a single super block may be detected at different time points, and a difference value may be obtained between the maximum memory-block-read-counts detected at the immediately previous and current time points for the single super block.

When a memory-block-read-count of one of the memory blocks included in the super block reaches a predetermined value, the controller 200 may control the read reclaim operation for the super block to be started. In accordance with the embodiment, a time point at which the read reclaim operation is first performed for the super block may be the first time point T1. In such a case, the controller 200 may decide a number of page groups, for which the read reclaim operation is to be performed at the first time point T1, on the basis of the memory-block-read-counts at the first time point T1, wherein the number of page groups, for which the read reclaim operation is to be performed at the first time point T1, may be a reference number of page groups for a simultaneous read reclaim operation.

Furthermore, on the basis of a difference value between the memory-block-read-counts at the first time point T1 and the second time point T2, the controller 200 may decide the number of page groups for which the read reclaim operation is to be performed at the second time point T2.

In accordance with the embodiment, the plurality of blocks included in a super block may be divided into a plurality of page groups, and the number of page groups, for which the read reclaim operation is to be performed, may vary according to the difference value obtained between the maximum memory-block-read-counts of the immediately previous and current time points for the super block. Specifically, when a quick read reclaim operation is required, that is, when the difference value obtained between the maximum memory-block-read-counts of the immediately previous and current time points for the super block is relatively great, the number of page groups, for which the read reclaim operation is to be performed, is increased, so that it is possible to substantially prevent data loss. When a relatively slow read reclaim operation is allowed, that is, when the difference value obtained between the maximum memory-block-read-counts of the immediately previous and current time points for the super block is relatively small, the number of page groups, for which the read reclaim operation is to be performed, is decreased, so that it is possible to quickly perform another operation (for example, a data write operation by a request of a host device) and thus efficient control of a memory system is possible.

Figure 5:
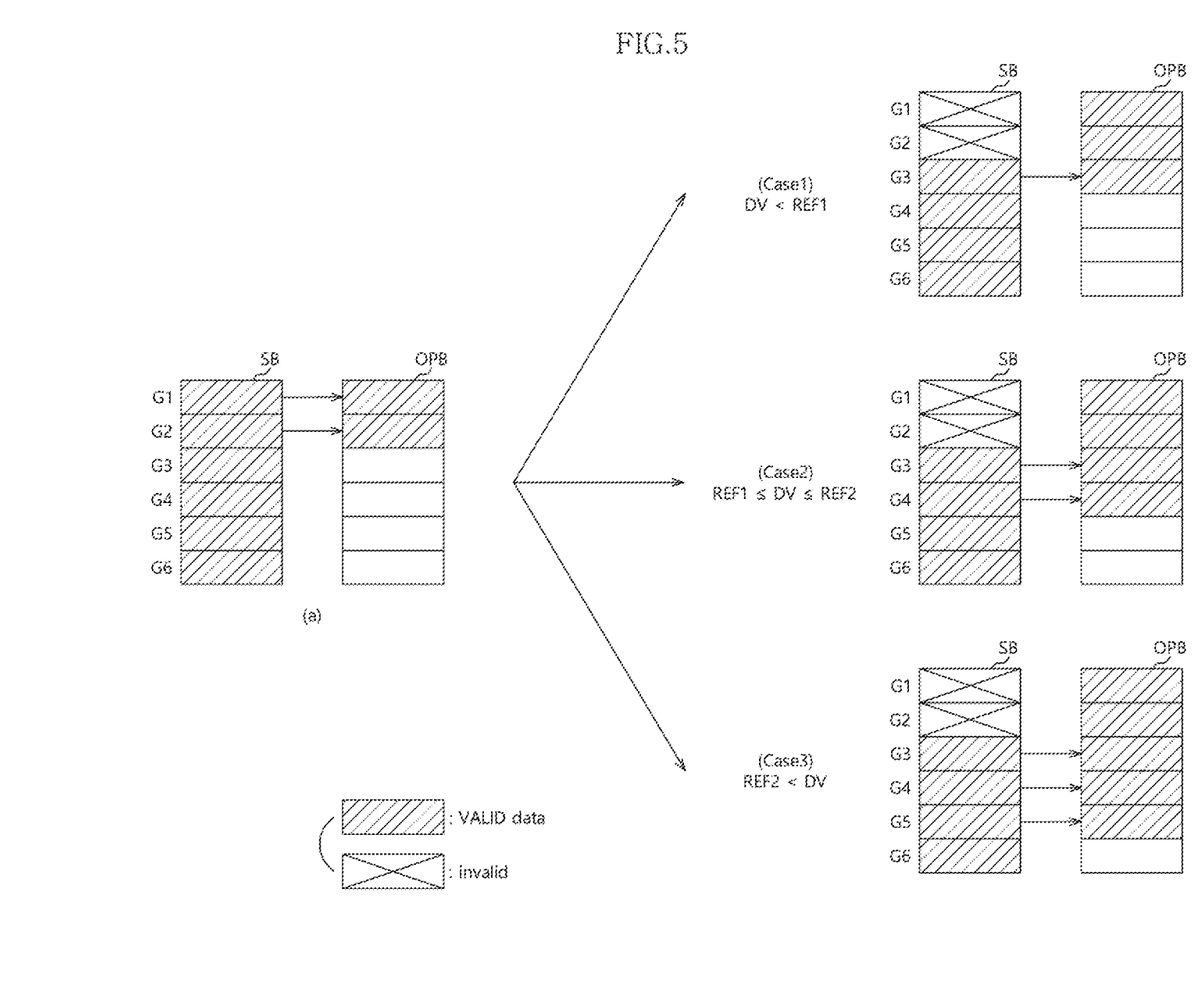
FIG. 5 is a diagram explaining a process to decide the number of page groups in accordance with the embodiment.

FIG. 5 is a diagram explaining a process to decide the number of page groups as a target of the read reclaim operation in a single super block in accordance with the embodiment. A first critical reference REF1 and a second critical reference REF2 may be comparison references for the difference value obtained between the maximum memory-block-read-counts of the immediately previous and current time points for the single super block. For convenience of description, it is assumed that a super block is divided into six page groups G1 to G6 in the example shown in FIG. 5; however, the present invention is not limited thereto and the number of applicable page groups may vary depending on design. Furthermore, two critical references REF1 and REF2 are used; however, the present invention is not limited thereto and at least one critical reference may be set. Hereinafter, a process in which the number of page groups as a target of the read reclaim operation is decided will be described with reference to FIGS. 1 and 5.

In step (a), the controller 200 may perform a read reclaim operation for the first page group G1 and the second page group G2. It is assumed that the read reclaim operation for the two page groups are simultaneously performed. That is, the reference number of page groups for a simultaneous read reclaim operation may be 2.

In accordance with the embodiment, a number of page groups as a target of a simultaneous read reclaim operation to be performed directly after the read reclaim operation for the first page group G1 and the second page group G2 may be determined according to the reference number of page groups for a simultaneous read reclaim operation and an adjusting number. The adjusting number may be decided based on the difference value DV obtained between the maximum memory-block-read-counts of the immediately previous and current time points for a super block described in FIG. 4 and the critical references REF1 and REF2. Furthermore, the critical references REF1 and REF2 may be set by the controller 200 and may be changed by the controller 200 according to operation environments of the memory system 100.

It is assumed that case 1 to case 3 to be described later indicate read reclaim operations which are performed directly after the read reclaim operation performed in step (a).

In accordance with the embodiment, the controller 200 may decide the adjusting number as a negative number when the difference value DV is less than the first critical reference REF1. In case 1, when the difference value DV is decided by the controller 200 to be less than the first critical reference REF1, the adjusting number may be decided to "−1". Accordingly, the number of page groups, for which the read reclaim is to be performed, may be smaller than the number of page groups, for which the read reclaim has been previously performed, by 1. As illustrated in the drawing, the read reclaim operation may be performed for the third page group G3, that is, one page group.

In accordance with the embodiment, the controller 200 may decide the adjusting number to "0" when the difference value DV is greater than or equal to the first critical reference REF1 and is less than or equal to the second critical reference REF2. In case 2, when the difference value DV is decided by the controller 200 to be greater than or equal to the first critical reference REF1 and is less than or equal to the second critical reference REF2, the adjusting number may be decided to "0". Accordingly, the number of page groups, for which the read reclaim is to be performed, may be equal to the number of page groups for which the read reclaim has been previously performed. As illustrated in the drawing, the read reclaim operation may be performed for the third page group G3 and the fourth page group G4, that is, two page groups.

In accordance with the embodiment, the controller 200 may decide the adjusting number as a positive number when the difference value DV exceeds (i.e., is greater than) the second critical reference REF2. In case 3, when the difference value DV is decided by the controller 200 to be greater than the second critical reference REF2, the adjusting number may be decided to "1". Accordingly, the number of page groups, for which the read reclaim is to be performed, may be larger than the number of page groups, for which the read reclaim has been previously performed, by 1. As illustrated in the drawing, the read reclaim operation may be performed for the third page group G3 to the fifth page group G5, that is, three page groups.

In accordance with the embodiment, the number of page groups, for which the read reclaim operation is to be performed, may be variously set. FIG. 5 illustrates that the adjusting number is decided to "−1", "0", and "1" according to the comparison results of the difference value DV and the critical references REF1 and REF2; however, the embodiment is not limited thereto and the adjusting number may be variously decided according to setting. Furthermore, the number of the critical references is not limited to 2 and may be variously set.

In accordance with the embodiment, until the read reclaim operation is performed for all the page groups G1 to G6 included in the super block SB, a process, in which the difference value DV is decided, the adjusting number is decided by comparing the difference value DV and the critical references REF1 and REF2 with each other, and the read reclaim operation is performed on the basis of the decided adjusting number, may be repeated.

Furthermore, in accordance with the embodiment, when the number of page groups, for which the read reclaim operation is not performed, among the page groups G1 to G6 included in the super block SB is less than or equal to the reference number of page groups for a simultaneous read reclaim operation, the read reclaim operation may be simultaneously performed for all the page groups for which the read reclaim operation is not performed. For example, after the process of case 3 is performed, the page group, for which the read reclaim operation is not performed, is the sixth page group G6. That is, since one page group smaller than 2 or the reference number of page groups for a simultaneous read reclaim operation remains, an operation for deciding the adjusting number may be omitted and the read reclaim operation may be performed for the sixth page group G6.

The memory system in accordance with the embodiment may be implemented in the form of an electronic device including a non-transitory machine-readable storage medium.

An electronic device in accordance with the embodiment may include a non-transitory machine-readable storage medium, which includes a plurality of memory blocks and stores coded instructions executable by a controller, and the controller, wherein the instructions may include instructions that substantially manage at least one memory block selected from the memory blocks as a super block, divide the super block into a plurality of page groups, decide the number of target page groups, for which the read reclaim for the super block is to be performed, on the basis of memory-block-read-counts of the memory blocks, and control the read reclaim operation to be performed for page groups having the decided number.

In accordance with the embodiment, the non-transitory machine-readable storage medium may include a nonvolatile memory device. The nonvolatile memory device may include any one of various types of nonvolatile memories such as a NAND flash memory device, a NOR flash memory device, a ferroelectric random access memory (FRAM) using a ferroelectric capacitor, a magnetic random access memory (MRAM) using a tunneling magneto-resistive (TMR) film, a phase change random access memory (PCRAM) using chalcogenide alloys, and a resistive random access memory (ReRAM) using an transition metal oxide.

Figure 6:
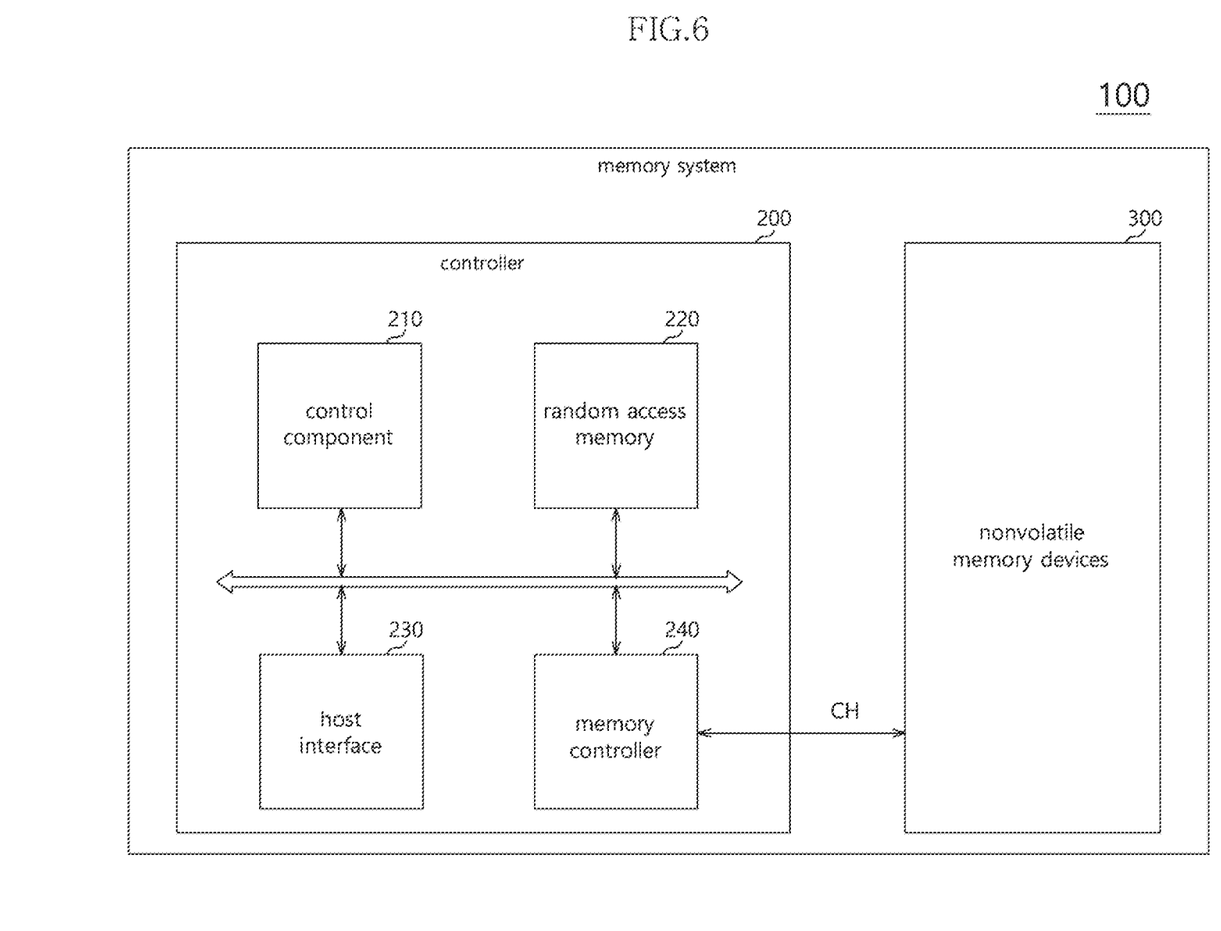
FIG. 6 is a detailed block diagram illustrating a configuration of a memory system in accordance with an embodiment.

FIG. 6 is a detailed block diagram illustrating a configuration of the memory system 100 in accordance with the embodiment.

The memory system 100 may include the controller 200. The controller 200 may include a control component 210, a random access memory 220, a host interface 230, and a memory controller 240.

The control component 210 may include a micro control unit (MCU) and a central processing unit (CPU). The control component 210 may process requests transmitted from the host device. In order to process the requests, the control component 210 may execute code type of instructions or algorithms loaded on the random access memory 220, that is, firmware (FW), and control internal functional blocks and the nonvolatile memory devices 301 to 303.

The random access memory 220 may include a random access memory such as a dynamic random access memory (DRAM) or a static random access memory (SRAM). The random access memory 220 may store the firmware (FW) executed by the control component 210. Furthermore, the random access memory 220 may store data required for executing the firmware (FW), for example, meta data. That is, the random access memory 220 may operate as a working memory of the control component 210.

The host interface 230 may serve as an interface between a host device (not illustrated) and the memory system 100. For example, the host interface 230 may communicate with a host device 400 by using any one of standard transmission protocols, such as a secure digital, a universal serial bus (USB), a multi-media card (MMC), an embedded MMC (eMMC), a personal computer memory card international association (PCMCIA), a parallel advanced technology attachment (PATA), a serial advanced technology attachment (SATA), a small computer system interface (SCSI), a serial attached SCSI (SAS), a peripheral component interconnection (PCI), a PCI Express (PCI-e or PCIe), and a universal flash storage (UFS), that is, a host interface.

The memory controller 240 may control a storage medium under the control of the control component 210. The memory controller 240 may also be called a memory interface. The memory controller 240 may provide control signals to the nonvolatile memory devices 301 to 303. The control signals may include commands, addresses, control signals and the like for controlling the nonvolatile memory devices 301 to 303. The memory controller 240 may provide data to the nonvolatile memory devices 301 to 303, or receive data from the nonvolatile memory devices 301 to 303.

FIGS. 7 to 10 are flowcharts describing an operating method of the memory system in accordance with the embodiment.

Figure 7:
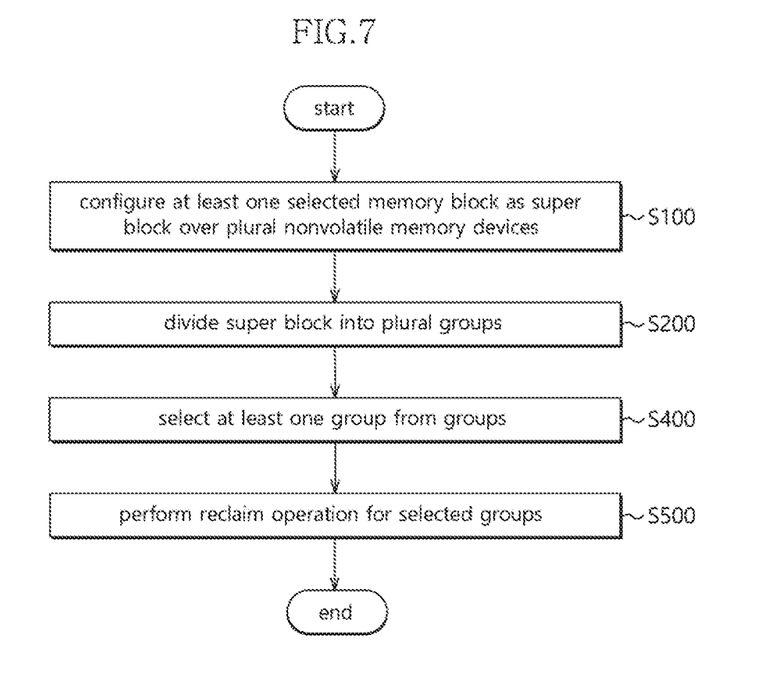
FIG. 7 to FIG. 10 are flowcharts describing an operating method of a memory system in accordance with an embodiment.

Referring to FIGS. 1 and 7, the controller may configure at least one selected memory block as a super block over the plurality of nonvolatile memory device 301 to 303 at step S100. At step S200, the controller 200 may divide the super block into a plurality of page groups. At step S400, the controller 200 may select at least one page group from the page groups. The controller 200 may then performing the read reclaim operation for the selected page groups, at step S500.

When dividing the super block into the plurality of page groups at step S200, the controller 200 may divide the super block into a plurality of page groups including at least one page from each of the selected memory blocks.

Figure 8:
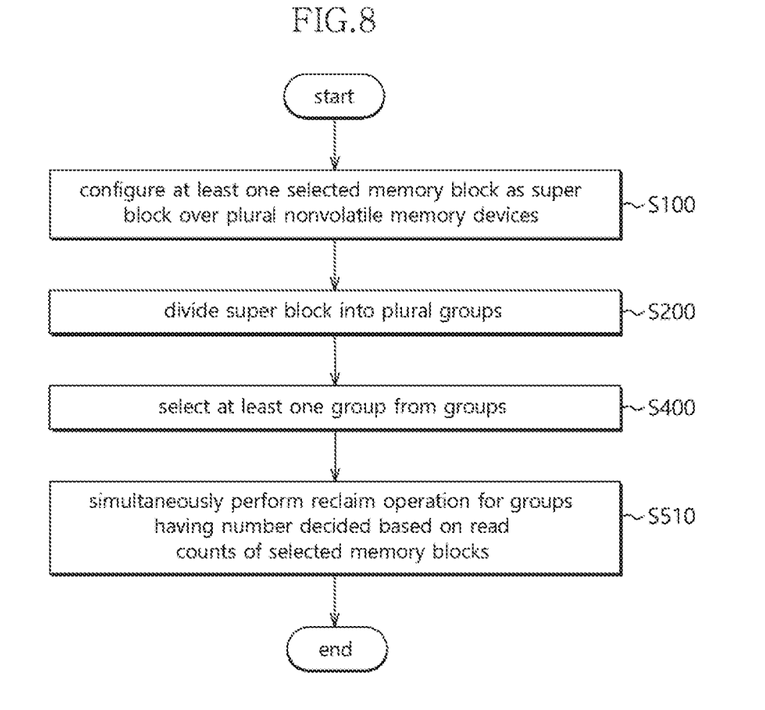

Referring to FIGS. 1 and 8, step S500 of FIG. 7 in which the controller 200 performs the read reclaim operation performed for the selected page groups may also include step S510 in which the controller 200 simultaneously performs the read reclaim operation for a number of page groups decided on the basis of the reference number of page groups for a simultaneous read reclaim operation. In FIG. 8, steps S100, S200, and S400 are substantially similar to the steps S100, S200, and S400 of FIG. 7. Therefore, overlapping descriptions will be omitted.

Figure 9:
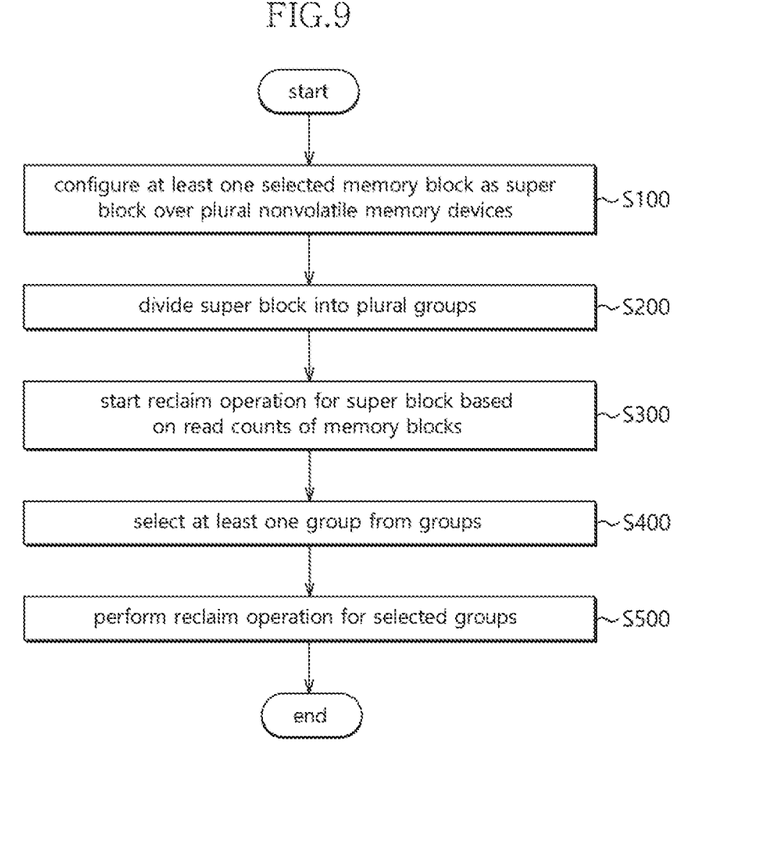

Referring to FIGS. 1 and 9, the operating method of the memory system in accordance with the embodiment may further include step S300 in which the controller 200 starts the read reclaim operation for the super block on the basis of the reference number of page groups for a simultaneous read reclaim operation. In FIG. 9, steps S100, S200, S400, and S500 are substantially similar to the steps S100, S200, S400, and S500 of FIG. 7. Therefore, overlapping descriptions will be omitted.

Figure 10:
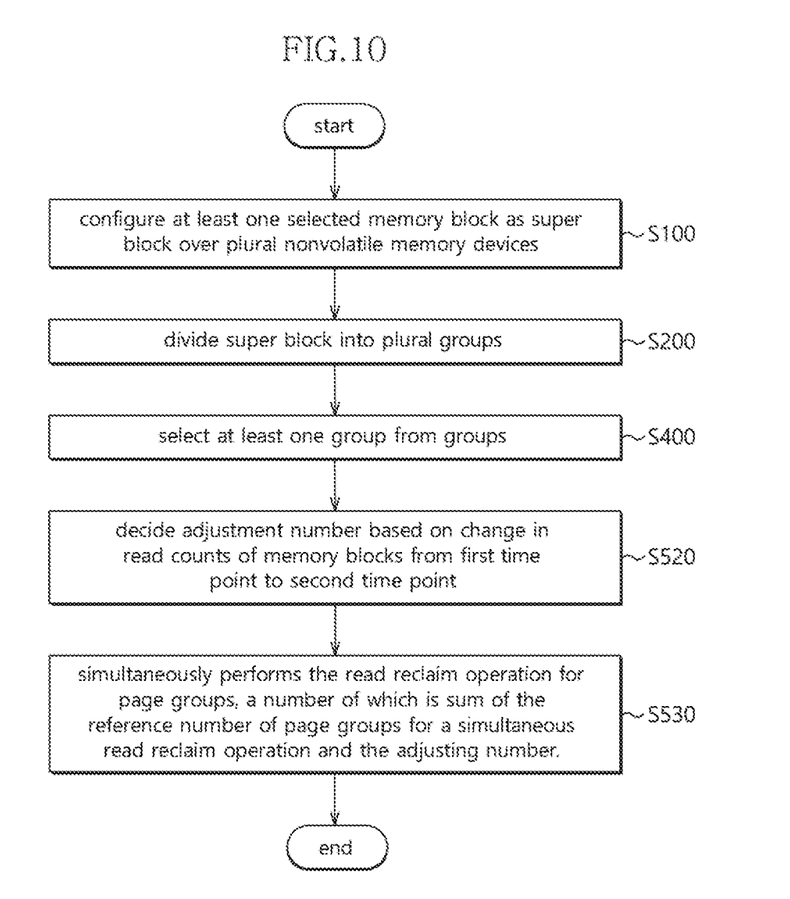

Referring to FIGS. 1 and 10, the operating method of the memory system in accordance with the embodiment may further include step S520 in which the controller 200 decides an adjusting number on the basis of the difference value DV obtained between the maximum memory-block-read-counts of the immediately previous and current time points for the super block, and step S530 in which the controller 200 simultaneously performs the read reclaim operation for page groups, a number of which is sum of the reference number of page groups for a simultaneous read reclaim operation and the adjusting number. In FIG. 10, steps S100, S200, and S400 are substantially similar to the steps S100, S200, and S400 of FIG. 7. Therefore, overlapping descriptions will be omitted.

In accordance with the embodiment, in step S520 of deciding the adjusting number on the basis of the difference value DV obtained between the maximum memory-block-read-counts of the immediately previous and current time points for the super block, the controller 200 may decide the adjusting number on the basis of a difference value DV between a maximum memory-block-read-count of the super block at the first time point and a maximum memory-block-read-count of the super block at the second time point. Furthermore, the controller 200 may decide the adjusting number by comparing the difference value DV and the critical references (e.g., the critical references REF1 and REF2) with each other.

Figure 11:
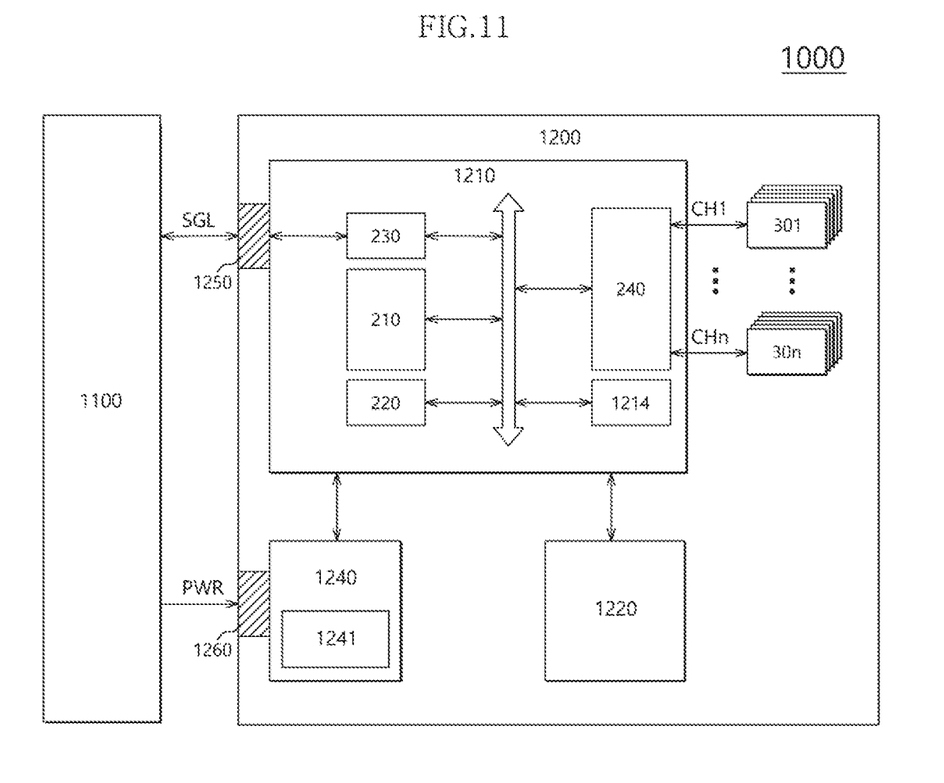
FIG. 11 is a diagram illustrating a data processing system including a solid state drive (SSD) in accordance with an embodiment.

FIG. 11 is a diagram illustrating a data processing system 1000 including a solid state drive (SSD) 1200 in accordance with an embodiment. Referring to FIG. 11, the data processing system 1000 may include a host device 1100 and the SSD 1200.

The SSD 1200 may include a controller 1210, a buffer memory device 1220, a plurality of nonvolatile memory devices 301 to 30n, a power supply 1240, a signal connector 1250, and a power connector 1260.

The controller 1210 may control general operations of the SSD 1200. The controller 1210 may include a host interface 230, a control component 210, a random access memory 220, an error correction code (ECC) component 1214, and a memory interface 240.

The host interface 230 may exchange a signal SGL with the host device 1100 through the signal connector 1250. The signal SGL may include a command, an address, data, and so forth. The host interface 230 may interface the host device 1100 and the SSD 1200 according to the protocol of the host device 1100. For example, the host interface 230 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-e or PCIe) and universal flash storage (UFS).

The control component 210 may analyze and process the signal SGL received from the host device 1100. The control component 210 may control operations of internal function blocks according to a firmware or a software for driving the SSD 1200. The random access memory 220 may be used as a working memory for driving such a firmware or software.

The ECC component 1214 may generate the parity data of data to be transmitted to at least one of the nonvolatile memory devices 301 to 30$n$. The generated parity data may be stored together with the data in the nonvolatile memory devices 301 to 30$n$. The ECC component 1214 may detect an error of the data read from at least one of the nonvolatile memory devices 301 to 30$n$, based on the parity data. If a detected error is within a correctable range, the ECC component 1214 may correct the detected error.

The memory interface 240 may provide control signals such as commands and addresses to at least one of the nonvolatile memory devices 301 to 30$n$, according to control of the control component 210. Moreover, the memory interface 240 may exchange data with at least one of the nonvolatile memory devices 301 to 30$n$, is according to control of the control component 210. For example, the memory interface 240 may provide the data stored in the buffer memory device 1220, to at least one of the nonvolatile memory devices 301 to 30$n$, or provide the data read from at least one of the nonvolatile memory devices 301 to 30$n$, to the buffer memory device 1220.

The buffer memory device 1220 may temporarily store data to be stored in at least one of the nonvolatile memory devices 301 to 30$n$. Further, the buffer memory device 1220 may temporarily store the data read from at least one of the nonvolatile memory devices 301 to 30$n$. The data temporarily stored in the buffer memory device 1220 may be transmitted to the host device 1100 or at least one of the nonvolatile memory devices 301 to 30$n$ according to control of the controller 1210.

The nonvolatile memory devices 301 to 30$n$ may be used as storage media of the SSD 1200. The nonvolatile memory devices 1231 to 123$n$ may be coupled with the memory interface 240 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 12:
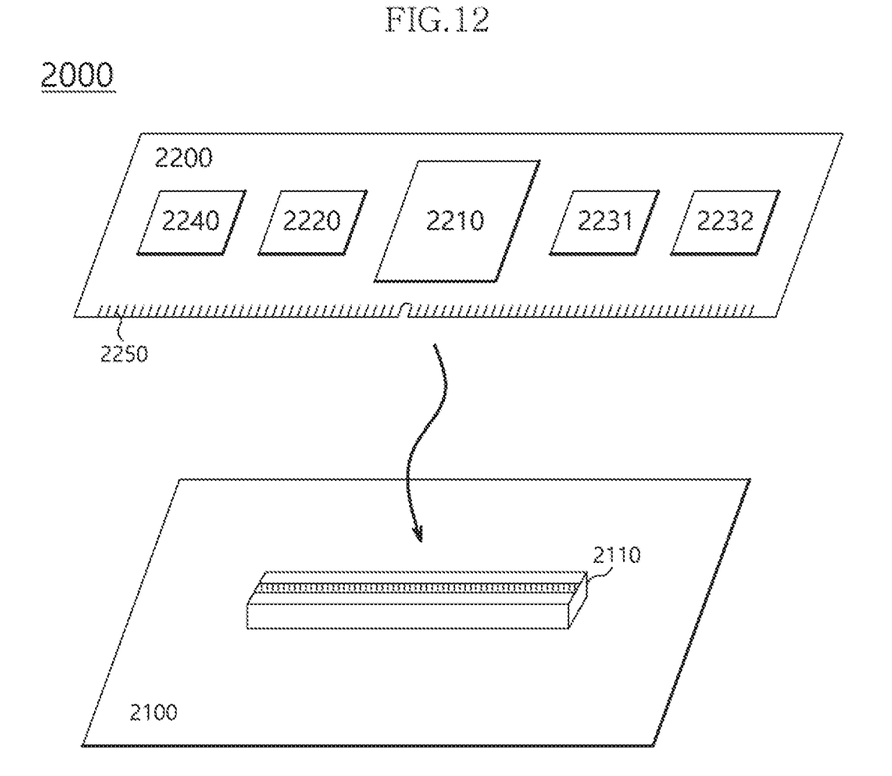
FIG. 12 is a diagram illustrating a data processing system including a memory system in accordance with an embodiment.

FIG. 12 is a diagram illustrating a data processing system 2000 including a memory system 2200 in accordance with an embodiment. Referring to FIG. 12, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 11.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 13:
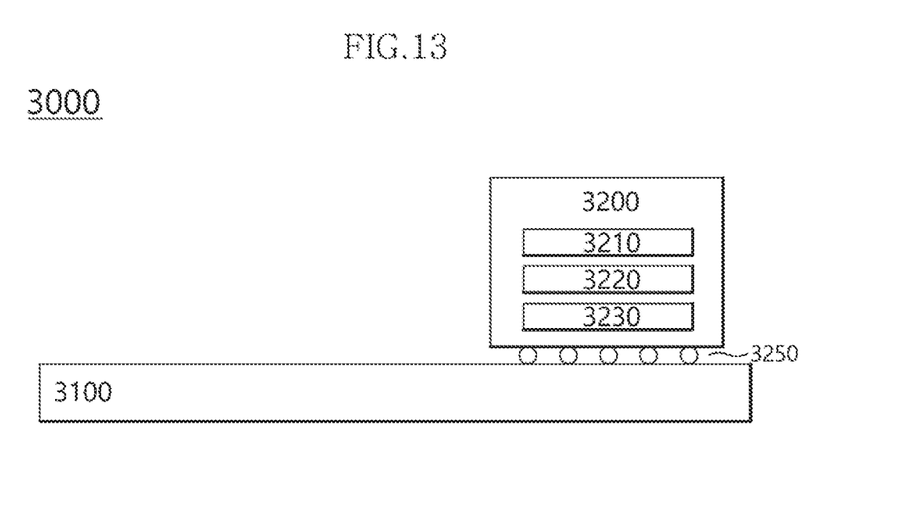
FIG. 13 is a diagram illustrating a data processing system including a memory system in accordance with an embodiment.

FIG. 13 is a diagram illustrating a data processing system 3000 including a memory system 3200 in accordance with an embodiment. Referring to FIG. 13, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 11.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 14:
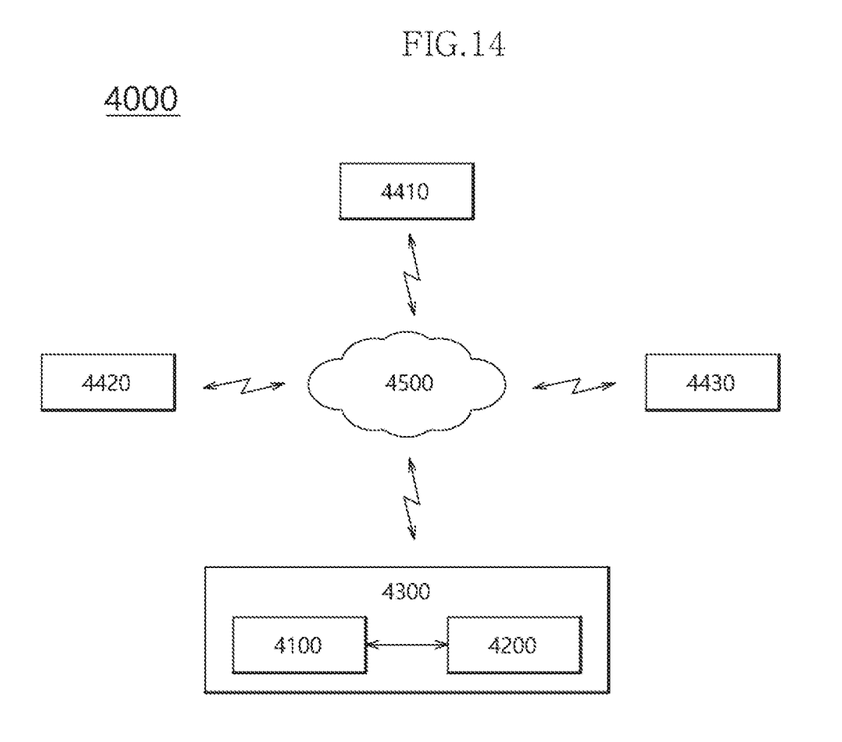
FIG. 14 is a diagram illustrating a network system including a memory system in accordance with an embodiment.

FIG. 14 is a diagram illustrating a network system 4000 including a memory system 4200 in accordance with an embodiment. Referring to FIG. 14, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the memory system 1200 shown in FIG. 11, the memory system 2200 shown in FIG. 12 or the memory system 3200 shown in FIG. 13.

Figure 15:
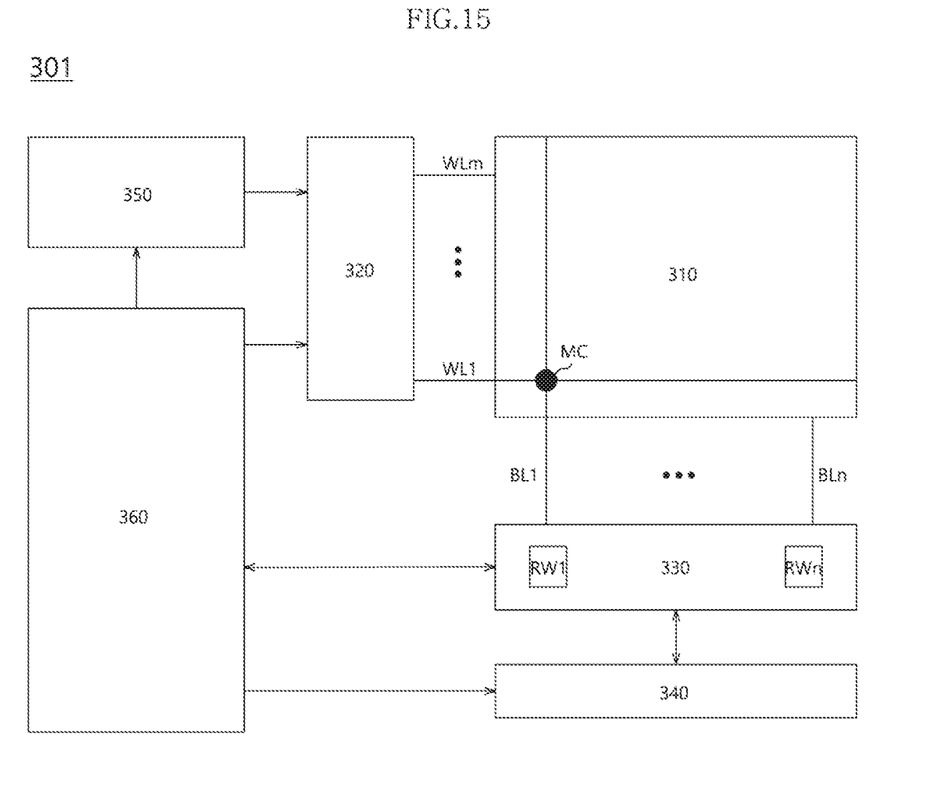
FIG. 15 is a block diagram illustrating a nonvolatile memory device included in a memory system in accordance with an embodiment.

FIG. 15 is a block diagram illustrating a nonvolatile memory device 300 included in a memory system in accordance with an embodiment. Referring to FIG. 15, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the memory system, the operating method thereof, and the electronic device described herein should not be limited based on the described embodiments.

What is claimed is:

1. A memory system comprising:
a plurality of nonvolatile memory devices each including a plurality of memory blocks; and
a controller configured to configure at least one memory block selected from the plurality of memory blocks as a super block, and to perform a read reclaim operation for the super block based on memory-block-read-counts of the super block,
wherein the controller divides the super block into a plurality of page groups,
decides an adjusting number based on a change in the memory-block-read-counts from a first time point to a second time point,
decides a first number by considering the adjusting number and a reference number,
selects a page group having the first number from the plurality of page groups, and
performs the read reclaim operation for the page group having the first number after the second time point.

2. The memory system according to claim 1, wherein, in the plurality of nonvolatile memory devices, each of the plurality of memory blocks includes a plurality of pages, and
the controller divides the super block into the plurality of page groups including at least one page of a plurality of pages of the selected at least one memory block.

3. The memory system according to claim 1, wherein the controller decides the adjusting number based on a difference value between a first maximum memory-block-read-count having a maximum value at the first time point and a second maximum memory-block-read-count having a maximum value at the second time point, among the memory-block-read-counts of the super block.

4. The memory system according to claim 3, wherein the controller decides the adjusting number by comparing the difference value and at least one critical reference with each other.

5. An electronic device comprising:
a controller; and a non-transitory machine-readable storage medium that includes a plurality of memory blocks and stores coded instructions executable by the controller, wherein the instructions includes instructions that substantially manage at least one memory block selected from the memory blocks as a super block, divide the super block into a plurality of page groups, decide a number of target page groups, for which a read reclaim for the super block is to be performed, based on memory-block-read-counts of the super block, and control a read reclaim operation to be performed for page groups having the decided number, and wherein the instruction that decides the number of target page groups includes an instruction that decides an adjusting number based on a change in the memory-block-read-counts from a first time point to a second time point and decides the number of target page groups by considering the adjusting number and a reference number.

6. The electronic device according to claim 5, wherein each of the plurality of memory blocks includes a plurality of pages and each of the plurality of page groups includes at least one page in the selected at least one memory block.

7. The electronic device according to claim 5, wherein the instruction that controls the read reclaim operation to be performed controls a read reclaim operation for a target page group corresponding to the decided number of target page groups to be performed after the second time point.

8. The electronic device according to claim 5, wherein the instruction that decides the adjusting number decides the adjusting number based on a difference value between a first maximum memory-block-read-count having a maximum value at the first time point and a second maximum memory-block-read-count having a maximum value at the second time point, among the memory-block-read-counts of the super block.

9. The electronic device according to claim 8, wherein the instruction that decides the adjusting number decides the adjusting number based on comparison between the difference value and at least one critical reference.

10. The electronic device according to claim 8, wherein the instruction that decides the adjusting number decides the adjusting number as a positive number when the difference value is greater than or equal to a critical reference.

11. The electronic device according to claim 8, wherein the instruction that decides the adjusting number decides the adjusting number as a negative number when the difference value is less than a critical reference.

12. A memory system comprising:
a storage including a super block including a plurality of page groups each including at least a single page from one of a plurality of memory blocks forming the super block; and
a controller configured to:
detect maximum memory-block-read-counts of the super block at predetermined time points;
obtain a variance of the maximum memory-block-read-counts between immediately previous and current ones among the predetermined time points;
select a target number of target page groups among the plurality of page groups; and
control the storage to perform a read reclaim operation to the target number of target page groups,
wherein the target number is sum of a reference number and an adjusting number decided based on the variance.

13. The memory system according to claim 12, wherein adjusting number increases when the variance falls in a first range and decreases when the variance falls in a second range.

* * * * *